United States Patent
Reykowski et al.

(10) Patent No.: US 6,590,395 B2
(45) Date of Patent: Jul. 8, 2003

(54) CONNECTOR DEVICE FOR A SENSOR OR ACTUATOR

(75) Inventors: Arne Reykowski, Erlangen (DE); Markus Vester, Nuremberg (DE)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/180,416

(22) Filed: Jun. 26, 2002

(65) Prior Publication Data

US 2003/0016017 A1 Jan. 23, 2003

(30) Foreign Application Priority Data

Jun. 26, 2001 (DE) .......................................... 101 30 615

(51) Int. Cl.$^7$ ................................................ G01V 3/00
(52) U.S. Cl. ...................................... 324/322; 439/950
(58) Field of Search ................................. 324/322, 318, 324/321, 300, 306, 307, 309, 314; 439/950, 38; 600/407, 421, 422

(56) References Cited

U.S. PATENT DOCUMENTS

| | | | |
|---|---|---|---|
| 4,757,213 A | | 7/1988 | Tigges et al. ............... 307/116 |
| 4,838,797 A | * | 6/1989 | Dodier .......................... 439/38 |
| 5,158,932 A | | 10/1992 | Hinshaw et al. ............... 505/1 |
| 5,243,289 A | * | 9/1993 | Blum et al. ................. 324/322 |
| 5,437,277 A | * | 8/1995 | Dumoulin et al. .......... 600/424 |
| 5,473,252 A | * | 12/1995 | Renz et al. .................. 324/318 |
| 6,307,370 B1 | | 10/2001 | Schauwecker et al. ...... 324/318 |
| 6,317,091 B1 | * | 11/2001 | Oppelt ........................ 343/742 |

FOREIGN PATENT DOCUMENTS

DE            199 55 117            5/2001

* cited by examiner

*Primary Examiner*—Louis Arana
(74) *Attorney, Agent, or Firm*—Schiff Hardin & Waite

(57) ABSTRACT

A connector device for a sensor or actuator is composed of two terminal elements releasably connected to one another. A first of these terminal elements including a first electrical conductor that is connected to the sensor or actuator and a second of these terminal elements including a second electrical conductor that is connectible to an evaluation unit. The two electrical conductors are fashioned as coil systems in the terminal elements that enable signal transmission by inductive coupling given a connection of the two terminal elements. Each of the coil systems is formed of at least two series-connected coils that have oppositely directed windings and that are dimensioned such that the sum of voltages induced in the coils by a uniform electromagnetic field yields zero for each of the coil systems. The present connector device can be advantageously utilized for the connection of surface coils to the system of a magnetic resonance system and enables a complete hermetic sealing of the surface coils.

9 Claims, 4 Drawing Sheets

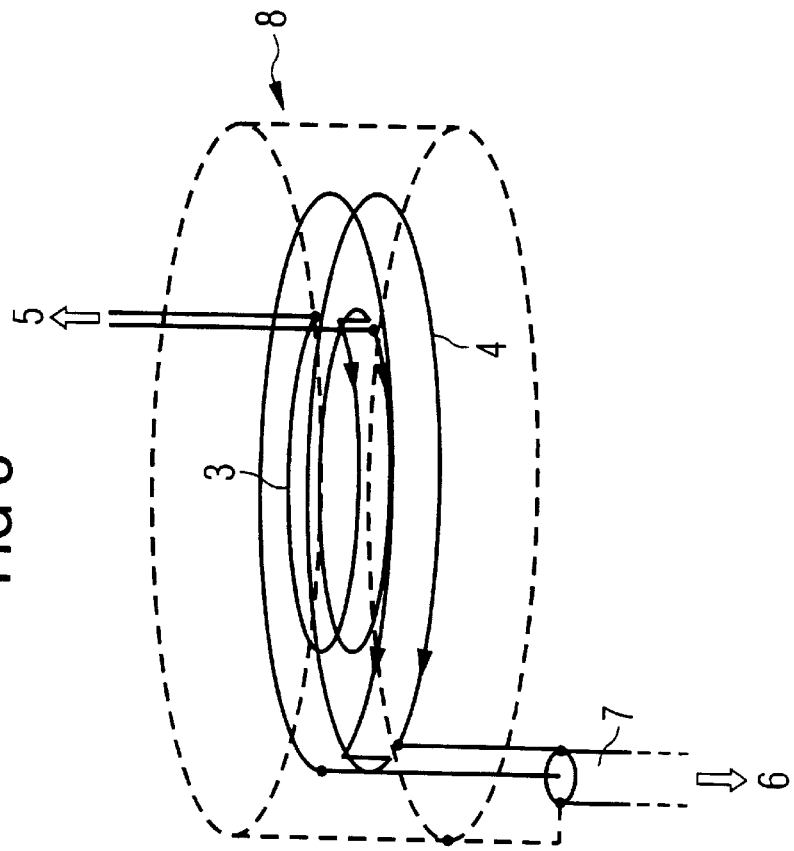
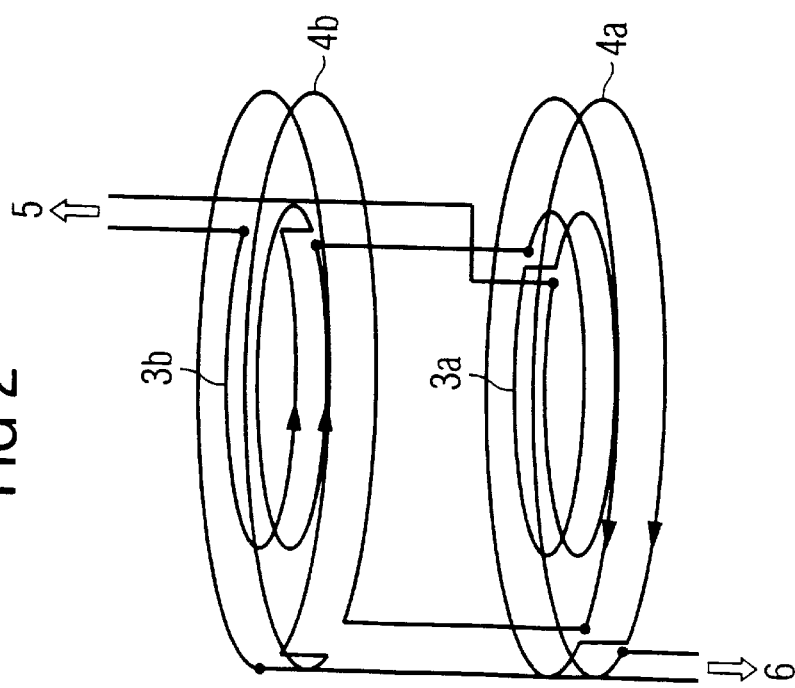

CONNECTOR DEVICE FOR A SENSOR OR ACTUATOR

BACKGROUND OF THE INVENTION

1. Field of the Invention

The present invention is directed to a connector device for a sensor or actuator, particularly for surface antennas in magnetic resonance systems, of the type composed of two terminal elements releasably connected to one another, a first of those terminal elements includes a first electrical conductor that is connected to the sensor or actuator and a second of these terminal elements includes a second electrical conductor that is connectible to an evaluation unit, whereby the first and second electrical conductors are coil systems that enable signal transmission by inductive coupling given a connection of the two terminal elements.

2. Description of the Prior Art

The acquisition and forwarding of sensor signals in a radio-frequency system, such as, for example, a magnetic resonance apparatus, makes high demands as to immunity to interference and dependability of the signal transmission. Magnetic resonance tomography is a known technique for acquiring images of the inside of the body of a living examination subject. A magnetic resonance tomography apparatus has a basic field magnet for generating a uniform magnetic field for the polarization of the atomic nuclei in the body to be examined, a number of gradient coils for the location coding of the magnetic resonance signals as well as one or more radio-frequency transmission antennas that emit radio-frequency pulses for triggering the magnetic resonance signals into the body to be examined. The magnetic resonance signals that are generated are acquired via a sensor and are supplied to an evaluation unit for the calculation of the magnetic resonance images. Either the radio-frequency transmission antenna utilized for the excitation of the magnetic resonance signals, referred to as the whole body antenna, or one or more radio-frequency reception antennas not rigidly connected to the magnetic resonance tomography apparatus, referred to as surface antennas, are utilized as sensors. Magnetic resonance images having a better signal-to-noise ratio can be registered with a surface antenna. It is brought close to the body region to be examined and is connected via a connecting cable to the evaluation unit of the magnetic resonance tomography apparatus.

The connection between the surface antenna and the evaluation unit is currently designed as a galvanic plug-type connector wherein one of the two terminal elements, that are releasably connectable to one another, is connected to the surface antenna and the other is connected to the evaluation unit. These plug-type connectors have the advantage of a flexible manipulation, since the surface antennas can be removed in a simple way and replaced by other surface antennas and can be connected to the evaluation unit via the plug-type connector.

One disadvantage of the known plug-type connectors, however, is that the electrical contacts can be only inadequately disinfected due to their being freely accessible. In the medical sector, however, a regular disinfection of the examination apparatus is important. Further, the problem arises given the known plug-type connectors that undesired sheath waves propagate on the leads, which may lead to a heating of adjacent body tissue that is unpleasant for the patient.

German PS 3616389 discloses a proximity switch acting in non-contacting fashion in a different technical field that is composed of a signal-processing part, a main part and a signal-acquiring sensor part that is pluggable to the main part. The signal and energy transmission between the sensor part and the main part given this proximity switch ensues via inductive coupling on the basis of integrated core coils that lie directly opposite one another when the two parts enter into a plug-type connection.

The same principle of signal transmission by inductive coupling is also utilized in a bio-magnetometer disclosed in German Translation 69029375. With this bio-magnetometer, extremely small magnetic fields are measured, these being generated, for example, by the brain of a patient. The bio-magnetometer contains a superconducting, magnetic pick-coil that is connected to a highly sensitive magnetic signal detector, a SQUID. The entire system is accommodated in Dewar vessels for producing the temperatures required for the super-conduction. The publication proposes that the pick-up coil and the magnetic signal detector be arranged in two different Dewar vessels that are detachably connected to one another. For the signal transmission, transmission coils are situated in each Dewar vessel that are fashioned and arranged such that they are coaxially thrust inside one another given a connection between the two Dewar vessels.

The principle of signal transmission by inductive coupling utilized in these two publications, however, does not seem suitable for operation in a magnetic resonance system, since the transmission coils are exposed to high radio-frequency fields therein that disturb the signal transmission and are also influenced by it.

SUMMARY OF THE INVENTION

An object of the present invention is to provide a connector device for a sensor or actuator, particularly for a surface antenna in a magnetic resonance system, that avoids the above disadvantages and can be unproblemmatically disinfected.

The object is achieved in a connector device according to the invention that is composed of two terminal elements releasably connectible to one another, with a first of these terminal elements includes a first electrical conductor that is connected to the sensor or actuator and a second of these terminal elements includes a second electrical conductor that is connectible to an evaluation unit. The first and second electrical conductor are coil systems that enable signal transmission by inductive coupling where the two terminal elements are connected to one another. Each of the coil systems is formed of at least two series-connected coils that have oppositely directed windings and are dimensioned such that the sum of voltages induced in the coils by a uniform electromagnetic field yields zero for each of the coil systems.

As a result of this fashioning of the connector device, the signals received by the sensor or sent to the actuator are not galvanically transmitted but are transmitted by inductive coupling between the two terminal elements of the connector device, for example of a plug-type connector. This design enables the complete hermetic sealing of the sensor or actuator with the first terminal element, so that no electrical conductors are exposed. This is especially advantageous for surface antennas that are potentially exposed to body fluids such as, for example, a prostate coil. With the inventive connector device, surface antennas that can be completely disinfected and sterilized can be achieved. In the same way, the second terminal element of the connector device, which may come into contact with the patient, can be completely hermetically sealed. As a result of a complete encapsulation, all disinfection measures can be unproblemmatically implemented, so that the inventive connector device is excellently suited for utilization in the medical field.

In the inventive connector device, reduction emission from the coupled connection, and the influence of external radio-frequency fields, are achieved by a special design of the two coil systems in the terminal elements. Each of the coil systems is formed of at least two series-connected coils that have oppositely directed windings and are dimensioned such that the sum of currents induced in the coils due to a uniform electromagnetic field yields zero for each of the coil systems. This is achieved by a suitable selection of the area and the number of turns in conjunction with the direction of the winding of the individual coils. The sum of the product of area and number of turns for all individual coils of each coil system must yield approximately zero, whereby oppositely directed numbers of turns are distinguished by opposite operational signs. Only as a result of this design is the disturbance-free utilization of the connector element enabled in radio-frequency fields as particularly occur in magnetic resonance systems.

Each coil system is preferably composed of two series-connected coils with the same dimensioning, i.e. same area and same number of turns, that are wound oppositely (in opposite senses). As a result of this design, the fields generated by the oppositely directed coils of the respective coil systems cancel nearly completely at the exterior of the connector. The fields of the coils are of adequate strength only in the close proximity region wherein the inductive coupling between the coil systems ensues.

Another advantage of the inventive connector device is that, given the connection via the connector device of one or more surface coils to the evaluation unit, significantly reduced leakage currents occur via the connecting line. By suppressing the common mode, moreover, the sheath waves are also suppressed, so that no heating that is unpleasant for the patient occurs given contact with the connecting cable.

In contrast to a conventional galvanic plug-type connectors, no wear of electrical contacts occurs given the inventive connector device.

The invention is explained below with reference to employment wherein the connector device produces a connection between a surface antenna fashioned as coil and the evaluation unit of a magnetic resonance system. Of course, other types of sensors or actuators can be connected to an evaluation unit with the present connector device. Examples are sensors for measuring blood pressure, temperature or a ECG or actuators for generating sound or electrical stimulation The structure of the connector device is the same as given employment with the surface antenna.

The connector device is composed of two terminals elements releasably connected to one another that are preferably designed as plug-type connectors. Each of the terminal elements contains a coil system. The coil system of one of the terminal elements is electrically connected to the surface coil either directly or via intermediate elements, for example a modulation circuit. The coil system of the other terminal element is connected or at least connectible to the evaluation unit via a connecting cable. For example, a conventional galvanic plug-type connector for the connection to the evaluation unit can be provided at that end of the connecting cable not connected to the coil system. The connecting cable, however, alternatively can be directly connected to the evaluation unit, i.e. non-releasably.

The terminal elements themselves are composed of an electrically non-conductive material, preferably a plastic. The same materials as are utilized for conventional galvanic plug-type connectors in the present field can be employed as materials in the inventive connector.

The two terminal elements must be fashioned such that they enable a releasable connection. This can ensue by means of different mechanical mechanisms that are known to a those skilled in the art in the field of releasable mechanical connections.

The two terminal elements are preferably fashioned as plug-type connectors; for example, one terminal element can represent a socket and the other can represent the appertaining plug.

In a preferred embodiment of the inventive connector device, the coil systems are fashioned and arranged in the terminal elements such that they are coaxially thrust inside one another when the releasable connection between the terminal elements is produced. This means that the coils of the one terminal element surround the coils of the other terminal element in the connection. In this way, an optimum inductive coupling is achieved between the two coil systems. The terminal elements, of course, must be fashioned such by appropriate shaping so that they enable this mutual positioning of the coil systems as a result of the connection.

For employment of the inventive connector device in a radio-frequency environment, an especially low emission toward the exterior and a low sensitivity relative to external RF fields must be insured. This is additionally supported in an embodiment of the inventive connector device wherein the coil system that is located at the outside in the coupled state is additionally surrounded by a shielding winding. This shielding winding is fashioned around the outer circumference of that coil system in its terminal element. Since the coupling to the other (inner) coil system of the other terminal element ensues within this shielding winding, the signal transmission is not degraded and the two coil systems are shielded from the environment.

In an embodiment of the inventive connector device, a loss-free matching network is additionally provided for the compensation of insertion losses in the inductive coupling, this being connected to the two inductances in the terminal elements.

In addition to the signal transmission from the surface coil to the evaluation unit, the surface coil or electrical components connected thereto can be charged with control signals or be supplied with energy via the connector device. To this end, one or more modulation circuits together with one or more frequency generators are arranged at the side of the second terminal element, for modulating additional control signals and/or signals for generating a supply voltage onto one or more carrier frequencies and for transmitting the modulated signal to the surface coil arrangement. At the other side of the surface coil arrangement, i.e., the first terminal element, at least one demodulation circuit is provided that extracts the corresponding control signals or for the voltage supply signals from the carrier frequency signal and makes the demodulated signal available to the electrical components.

DESCRIPTION OF THE DRAWINGS

FIG. 2 shows an example of the basic fashioning of the coil systems of the inventive connector device.

FIG. 3 shows another example of the basic design of the coil systems of the inventive connector device.

DESCRIPTION OF THE PREFERRED EMBODIMENTS

Figure 1:
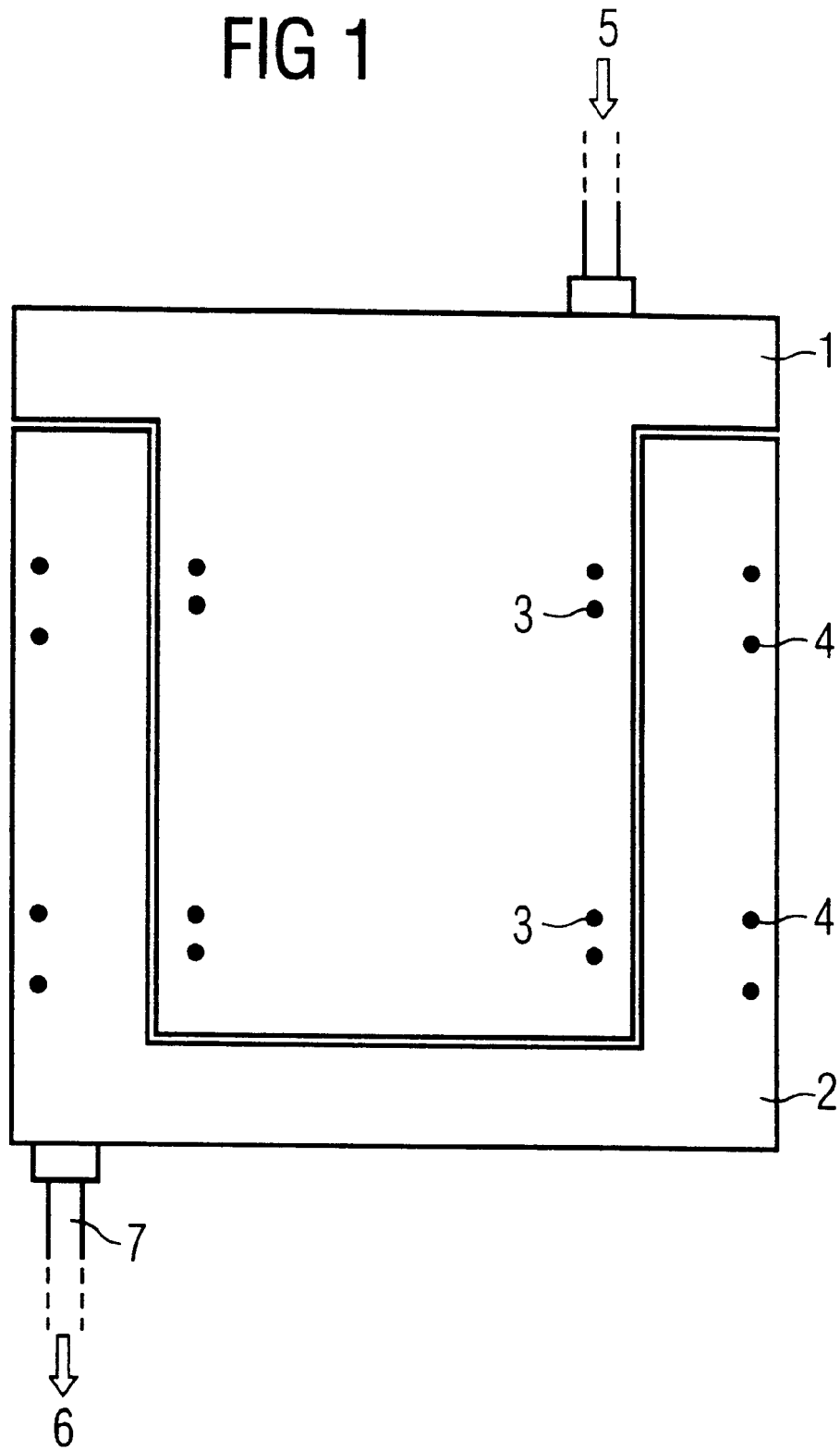
FIG. 1 schematically illustrates an exemplary embodiment of the terminal elements of the connector device of the present invention.

FIG. 1 schematically shows an example of a design of the terminal elements 1, 2 of the inventive connector device. The first terminal element 1 is fashioned as a cylindrical plug element that can be introduced into a corresponding socket-shaped opening of the second terminal element 2, fashioned as cooperating member. In this introduced position, which is shown in FIG. 1, the two terminal elements 1, 2 can be mechanically fixed, for example by means of a snap-in mechanism. The inductances 3, 4 in the respective terminal elements 1, 2 are only schematically indicated in FIG. 1. The first terminal element 1 is connected to the housing of the surface coil by a cable or is directly integrated into this housing. The second terminal element 2 is connected to a cable 7 that leads to a component of the magnetic resonance system, particularly to an evaluation unit, or that can be plugged thereto.

FIG. 2 shows an example of the design of the coil systems in the terminal elements 1, 2 as presented, for example, in FIG. 1. FIG. 2 schematically shows the coil arrangement or coil system 3 of the first terminal element 1 and the coil arrangement or coil system 4 of the second terminal element 2 in a condition wherein the two terminal elements 1, 2 are connected to one another. In this condition, the coil arrangement 3 of the first terminal element 1 is coaxially inserted into the coil arrangement 4 of the second terminal element 2. The electrical connections of the coil arrangements 3, 4 to the surface coil 5 or to the system, i.e. to the evaluation unit 6, are likewise schematically indicated.

The present example shows an embodiment of the coil systems of the connector device wherein disturbances due to external signals, for example due to the RF excitation field of the whole-body antenna, as well as unwanted emission and feedback of the transmitted signal are reduced. This is achieved by the coupling inductances 3, 4 of each terminal element 1, 2 being formed, by two coils 3a, 3b, and 4a, 4b (rather than being formed of one coil), of the same size having oppositely directed windings. The winding sense is indicated by the arrows in FIG. 2. The coil arrangement of the first terminal element 1 is composed of a lower coil 3a and an upper coil 3b with respective winding directions proceeding oppositely. The coils 3a, 3b are connected to one another in series. The two coils 4a and 4b of the second terminal element 2 are fashioned in the same way. The different winding directions of the coils causes a significant reduction of the field generated by the coils with increasing distance from the coils. In the same way, the coils are insensitive to external electromagnetic fields. The spacing of the two coils 3a, 3b, and 4a, 4b, of each coil pair should lie in the range of the Helmholtz distance. Given this spacing, a significant reduction of the generated field is achieved in the environment without disadvantageously influencing the inductive coupling between the coil pair 3 of the first terminal element 1 and the coil pair 4 of the second terminal element 2, which are disposed close to one another given a connection of the two terminal elements 1, 2.

The different dimensioning of the coil arrangements 3, 4 of the two terminals elements also can be seen from FIG. 2. The coil pair 3a, 3b of the plug 1 has a diameter that is smaller than the diameter of the coil pair 4a, 4b of the socket 2. As a result, they can be unproblemmatically inserted into one another. In the connected position, an optimum coupling between the coil pairs 3 and 4 is achieved as a result of the slight spacing of the coils.

Another example for an arrangement of the coil systems of the terminal elements 1 and 2 of the inventive connector device is shown in FIG. 3. In this Figure, only one coil is shown for each coil system for reasons of simplified illustration, said one coil representing the respective coil system. The two coil systems 3, 4 of the two terminal elements 1, 2, in this embodiment again have different diameters, so that they are inserted into one another when producing the connection. In order to avoid an unwanted emission into the outside space, the coil system of the second terminal element 2 is surrounded with a RF shield 8 in the present example. This shield shields both coil systems 3, 4 from the outside space when the coil system 3 of the first terminal element 1 is inserted without influencing the coupling between the coil systems 3, 4. The shielding, which preferably exhibits the shape of a cup open at one side, is fashioned in the terminal element 2 of the larger coil system 4.

Even though the individual coils 3, 4, 3a, 3b, 4a, 4b are shown with two coil windings in the present example, it is evident that the coils also can be fashioned with only one turn or with more than two turns.

Figure 4:
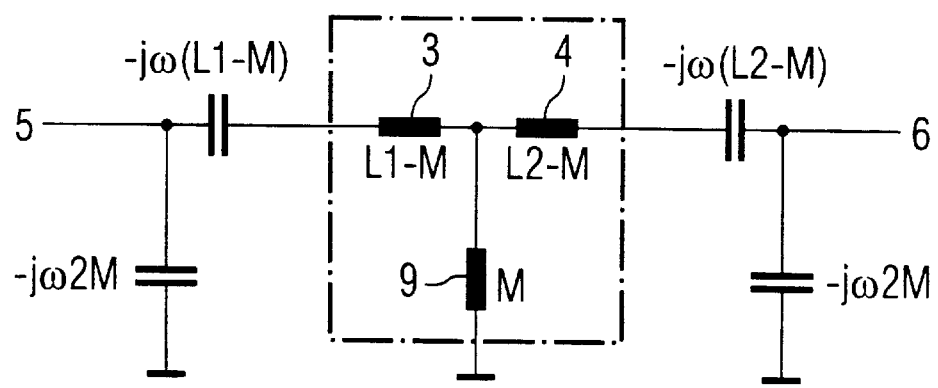
FIG. 4 shows an example of a matching circuit for compensating the reactive insertion attenuation in the inventive connector device.

For reducing the insertion losses that occur in an inductive coupling path as in the inventive connector device, a matching circuit can be provided at the two terminal elements 1, 2. Such a matching circuit is shown as an example in FIG. 4, which shows an equivalent circuit diagram for the inductive coupling with the two coil systems or, respectively, inductances L1 (3) and L2 (4). The coupling losses indicated with the equivalent inductance M(9) are compensated by correspondingly selected capacitances having the magnitudes $-j\omega(L1-M)$, $-j\omega(L2-M)$ and $-j\omega 2M$. Such matching circuits are known to those skilled in the art.

Figure 5:
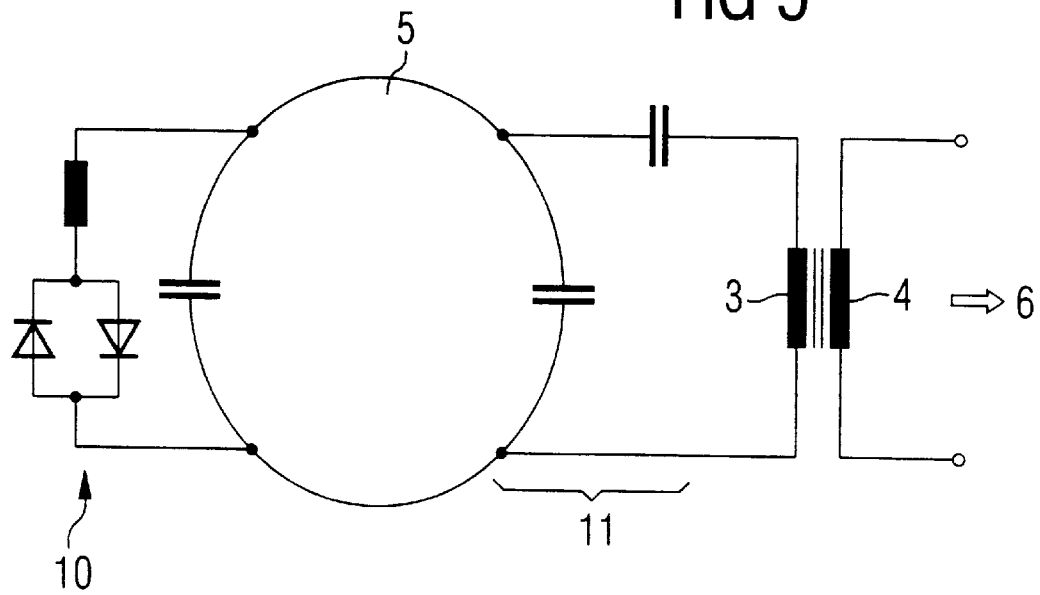
FIG. 5 is an example of the electrical arrangement of a surface coil of a magnetic resonance system with the inventive connector device.

FIG. 5 shows an example of the electrical structure of a simple magnetic resonance surface antenna with passive detuning circuit and the present connector device. The surface coils in a magnetic resonance system must be connected to a detuning circuit in order, given an excitation of the examination subject with the radio-frequency pulses, to bring the whole-body antenna out of resonance in order to avoid disturbances. Passive as well as active detuning circuits can be utilized. In the present example, the surface coil 5 is connected to a passive detuning circuit 10 that is composed of a coil and a capacitor as well as a diode circuit. The diodes respond above a specific voltage induced at the coil and thereby produce a detuning of the surface antenna 5. The antenna 5 is connected via matching network 11 to the inductance 3 of the first terminal element. This is inductively coupled to the inductance 4 of the second terminal element, which is in turn electrically connected to the system 6. The inductive coupling indicated with the two inductances 3 and 4 in FIG. 5 can ensue with a connector device according to the exemplary embodiments of FIGS. 1 through 3.

Such an embodiment can be very advantageously utilized in a magnetic resonance system. Since the received magnetic resonance signals are already modulated onto a carrier frequency, no further modulation circuit is required between the surface coil 5 and the inductance 3 of the connector device.

Figure 6:
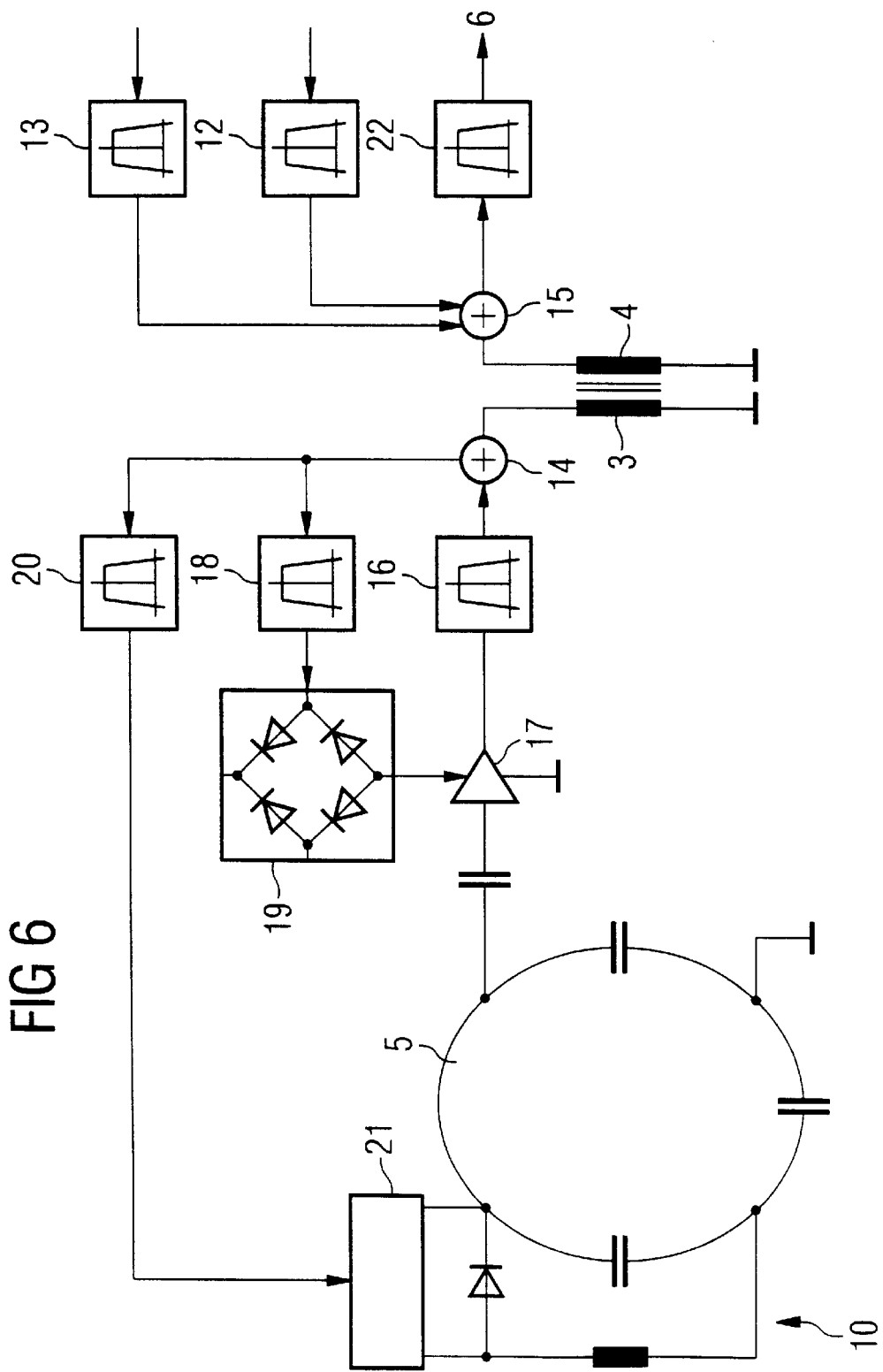
FIG. 6 is another example of the electrical arrangement of a surface coil of a magnetic resonance system with the inventive connector device.

FIG. 6 shows a further exemplary embodiment of a magnetic resonance surface antenna 5 with the present connector device. In this exemplary embodiment, the antenna 5 is provided with an active detuning circuit. The active detuning circuit is controlled by a detuning signal transmitted from the magnetic resonance system that is received by a detector 21. The detuning circuit 10 also includes a capacitor and a coil. The surface coil 5 in this example is connected to an amplifier 17 that additionally amplifies the received magnetic resonance signal. In this example, as well, the signal is transmitted to the system via the connector device having two inductances 3, 4.

In this example, a number of frequency modulators with appertaining frequency generators are provided at the side of the second terminal element with the inductance 4. One modulator 12 thereby serves the purpose of modulating the detuning signal for the detuning circuit 10 of the surface coil 5 onto a carrier frequency. A further modulator 13 serves the purpose of modulating signals for generating a supply voltage via a further carrier frequency. A demodulator 22 also is provided for extracting the magnetic resonance signal from a carrier frequency. The carrier frequencies with the signals modulated thereon are transmitted via corresponding transmission devices (mixers 14 and 15) via the inductances 3, 4 of the connector device. Accordingly, demodulation units 18 must be provided at the side of the surface coil 5 for extracting the supply voltage from the transmitted carrier frequency and demodulation units 20 must be provided thereat for extracting the detuning signal. Further, a rectifier 19 can be seen in FIG. 5 for converting the received alternating voltage into a DC voltage. A modulator 16 can likewise be arranged at the side of the surface coil 5 for the transmission of the magnetic resonance signal.

Given this design, it is not only the received magnetic resonance signals that can be transmitted to the system; but also control signals and a voltage supply can be transmitted from the system to the surface coil by means of modulation onto a radio-frequency frequency. The carrier frequencies for the control signals and voltage supplies are selected such that their harmonics lie outside the occurring magnetic resonance spectra as well as outside the intermediate frequency products contained in the signal path. Such intermediate frequencies occur, for example, at 2.5 MHz. The transmission itself can either ensue via a common coupling path in frequency-division multiplex when the signals occupy different frequency bands or can also ensue via separate coupling paths by forming separate connector devices for connector devices having a number of coupling inductances that are independent of one another.

Although modifications and changes may be suggested by those skilled in the art, it is the intention of the inventors to embody within the patent warranted hereon all changes and modifications as reasonably and properly come within the scope of their contribution to the art.

We claim as our invention:

1. A connector device comprising
   a first terminal element and a second terminal element releasably connected to each other;
   said first terminal element comprising a first electrical conductor adapted for connection to a component selected from the group consisting of sensors and actuators;
   said second terminal element comprising a second electrical conductor adaptable for connection to an evaluation unit for said component;
   said first electrical conductor and said second electrical conductor each forming a coil system and said coil systems being inductively coupled upon connection of said first and second terminal elements; and
   each of said coil systems being formed by at least two series-connected coils having oppositely directed windings and being dimensioned so that a sum of voltages induced in the at least two series-connected coils of the coil system, by a uniform magnetic field, is zero.

2. A connector device as claimed in claim 1 wherein said coil systems are respectively disposed in the first and second terminal elements so that one of said coil systems is co-axially inserted inside the other of said coil systems by connection of said first and second terminal elements.

3. A connector device as claimed in claim 2 wherein one of said coil systems is pushed over the other of said coil systems upon connection of said first and second terminal elements, and further comprising a radio-frequency shielding surrounding said-one of said coil systems.

4. A connector device as claimed in claim 1 wherein, in each of said coil systems, the at least two series-connected coils have identical dimensions.

5. A connector device as claimed in claim 1 wherein each of said coil systems comprises a loss-free matching network for compensating insertion losses in said inductive coupling.

6. A connector device as claimed in claim 1 further comprising:
   a modulation circuit having a frequency generator for transmitting a transmitted signal selected from the group consisting of control signals and signals for generating a supply voltage, by modulation onto a carrier frequency, said modulation circuit being connected to said coil system of said second terminal element and being adapted for connection to said evaluation unit; and
   a demodulation circuit for receiving said transmitted signal, as a received signal and for demodulating said received signal, said demodulation circuit being connected to said coil system in said first terminal element and being adapted for connection to said component.

7. A connector device as claimed in claim 1 wherein said first and second terminal elements have a plug-type connection to each other.

8. A connector device as claimed in claim 7 wherein one of said first and second terminal elements is a plug and the other of said first and second terminal elements is a socket.

9. In a magnetic resonance apparatus having a surface antenna and a unit which exchanges signals with said surface antenna, the improvement of a connector device comprising:
   a first terminal element and a second terminal element releasably connected to each other;
   said first terminal element comprising a first electrical conductor connected to said surface antenna;
   said second terminal element comprising a second electrical conductor connected to said unit;
   said first electrical conductor and said second electrical conductor each forming a coil system enabling signal exchange between said coil systems by inductive coupling given a connection of said first and second terminal elements; and
   each of said coil systems being formed by at least two series-connected coils having oppositely directed windings and dimensions so that a sum of voltages induced in said at least two series-connected coils, by a uniform electromagnetic field, is zero.

* * * * *